(12) United States Patent
Hoisington et al.

(10) Patent No.: US 8,979,247 B2
(45) Date of Patent: Mar. 17, 2015

(54) BONDED MICROELECTROMECHANICAL ASSEMBLIES

(75) Inventors: Paul A. Hoisington, Hanover, NH (US); Marc A. Torrey, Windsor, VT (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 138 days.

(21) Appl. No.: 13/146,513

(22) PCT Filed: Jan. 20, 2010

(86) PCT No.: PCT/US2010/021470
§ 371 (c)(1),
(2), (4) Date: Oct. 7, 2011

(87) PCT Pub. No.: WO2010/088111
PCT Pub. Date: Aug. 5, 2010

(65) Prior Publication Data
US 2012/0019598 A1    Jan. 26, 2012

Related U.S. Application Data

(63) Continuation of application No. 12/361,439, filed on Jan. 28, 2009, now abandoned.

(51) Int. Cl.
*B41J 2/14* (2006.01)
*H01L 21/62* (2006.01)
*B41J 2/45* (2006.01)
*B81C 1/00* (2006.01)

(52) U.S. Cl.
CPC ......... *B81C 1/00904* (2013.01); *B81C 1/00119* (2013.01); *B81B 2201/058* (2013.01); *B81C 2201/0143* (2013.01); *B81C 2201/019* (2013.01)
USPC .............................. 347/47; 438/21

(58) Field of Classification Search
USPC ......................... 347/47, 68; 438/21
See application file for complete search history.

(56) References Cited

U.S. PATENT DOCUMENTS

| 5,992,978 | A | 11/1999 | Fujii et al. | |
| 7,090,325 | B2 | 8/2006 | Hashimoto et al. | |
| 7,302,309 | B2* | 11/2007 | Scott et al. | 700/166 |
| 2001/0055053 | A1 | 12/2001 | Kataoka et al. | |
| 2004/0180473 | A1* | 9/2004 | Kawai | 438/114 |
| 2007/0111390 | A1* | 5/2007 | Komura et al. | 438/113 |

FOREIGN PATENT DOCUMENTS

| CN | 1250720 | 4/2000 |
| JP | 08-001952 | 1/1996 |

(Continued)

OTHER PUBLICATIONS

What is PZT?|PZT Theory, Introduction paragraph.*
Machine Translation of JP 2827884/JP 07-223318, Nov. 25, 1998.*
Machine Translation of JP 09-141879, Jun. 3, 1997.*
Machine Translation of JP 11-254675, Sep. 21, 1999.*

(Continued)

*Primary Examiner* — Lisa M Solomon
(74) *Attorney, Agent, or Firm* — Fish & Richardson P.C.

(57) ABSTRACT

A MEMS device is described that has a body with a component bonded to the body. The body has a main surface and a side surface adjacent to the main surface and smaller than the main surface. The body is formed of a material and the side surface is formed of the material and the body is in a crystalline structure different from the side surface. The body includes an outlet in the side surface and the component includes an aperture in fluid connection with the outlet.

19 Claims, 4 Drawing Sheets

(56) References Cited

FOREIGN PATENT DOCUMENTS

| | | |
|---|---|---|
| JP | 09-141879 | 6/1997 |
| JP | 2827884 | 9/1998 |
| JP | 11-254675 | 9/1999 |
| JP | 2000-103059 | 4/2000 |
| JP | 2002-248772 | 9/2002 |
| JP | 2004-273895 | 9/2004 |
| JP | 2007-165855 | 6/2007 |
| JP | 2008-311333 | 12/2008 |
| WO | WO 2007006618 A1 * | 1/2007 |

OTHER PUBLICATIONS

International Search Report and Written Opinion received in international application No. PCT/US2010/021470 dated Aug. 17, 2010, 8 pgs.

Japanese Office Action, with English Translation, JP Application No. 2011-548062, Feb. 4, 2014, 8 pages.

Chinese Office Action, with English translation, CN Application No. CN201080005699.0, mailed Jul. 10, 2014, 21 pages.

Japanese Office Action, with English Translation, JP Application No. 2011-548062, Sep. 30, 2014, 7 pages.

* cited by examiner

BONDED MICROELECTROMECHANICAL ASSEMBLIES

RELATED APPLICATIONS

This application is the national stage of International Application Number PCT/TUS2010/021470, filed on Jan. 20, 2010, which is a continuation of and claims priority to U.S. patent application Ser. No. 12/361,439, filed on Jan. 28, 2009, all of which are incorporated herein by reference in their entireties.

TECHNICAL FIELD

This invention relates to bonded microelectromechanical assemblies.

BACKGROUND

A microelectromechanical system (MEMS) typically has mechanical structures formed in a semiconductor substrate using conventional semiconductor processing techniques. A MEMS can include a single structure or multiple structures. MEMS have an electrical component, where an electrical signal activates each or is produced by actuation of each structure in a MEMS.

MEMS can be formed by laminating a series of layers, where one or more of the layers include apertures or recesses. Alternatively, MEMS can be formed by successive deposition and etching processes. Combinations of laminating and deposition and etching processes can also be used. Some MEMS include a series of repeating structures. Typically, it is desirable to be able to form reproducibly uniform features for each repeating structure. Reproducibility can depend in part on stable processing conditions.

A series of MEMS containing dies can be formed on a single substrate. Once the features that form the MEMS are completed, the dies can be released from the substrate, such as by sawing the substrate into the individual dies. Alternatively, streets or kerfs can be etched into one or both sides of the substrate and the dies can be manually broken off by snapping the substrate along the streets or kerfs. As shown in FIG. 1, this method often leaves damage on the edge of the die 10, such as chips 20, for example, areas where a piece or fragment is missing, rough edges or burrs 30 of excess material. This damage can be removed, if required, by polishing. However, polishing can create slag or other debris. Therefore, the chips, microcracks or burrs are typically left on the diced edges.

SUMMARY

MEMS containing dies can be formed by creating features in a substrate and using subsurface focused laser dicing to form individual dies from the substrate. An adhesive is then used to bond a component onto a surface formed by the dicing. The subsurface focused laser dicing method creates little to no debris, obviating the need to perform further processing, such as polishing or cleaning, in order to create a surface suitable for adhesive bonding.

In one aspect, an assembly is described. The assembly includes a body having a main surface and a side surface adjacent to the main surface and smaller than the main surface. A component is bonded to the side surface with an adhesive. The body includes an outlet in the side surface and the component includes an aperture in fluid connection with the outlet, wherein the body is formed of a material and the side surface is formed of the material and the body is in a crystalline structure different from the side surface.

In another aspect, a method of forming an assembly is described. The method includes laser dicing a body containing single crystalline material to form a die including MEMS, wherein the laser dicing focuses laser light at a plurality of points through a thickness of the body, the points defining a side surface of the die and bonding the surface to a component.

The devices and techniques described herein may include one or more of the following. The body can be formed of crystalline silicon and the side surface can be formed of polysilicon. The side surface can be free from chips and burrs. The outlet can be in fluid communication with a chamber and the assembly can further include an actuator associated with and configured to change a volume of the chamber. The component can be a nozzle plate and the aperture can be a nozzle. The side surface can be a substantially flat planar surface. The side surface can have a surface with a roughness between about 5 Angstroms and 5 microns ra. The side surface may not be a polished surface. The side surface can be perpendicular to the main surface. The body can have a plurality of outlets in the side surface that are in fluid communication with a plurality of apertures in the component. A recess can be formed in a main surface of a substrate. The substrate can be part of the body and the main surface of the substrate can be perpendicular to the side surface of the body. Forming the recess in the main surface and laser dicing the body can form an outlet in the side surface. Bonding the surface to a component can include bonding a component having an aperture therein so that the aperture is in fluid communication with the outlet. The outlet can be fluidly connected to a chamber that defines a volume and a transducer can be bonded to the body, where the transducer is configured to modify the volume when actuated. A second surface that is perpendicular to a main surface of the substrate can be laser diced. The second surface can be used to align the die to a wall. The single crystalline material can be silicon and laser dicing can form the surface of polysilicon. The laser dicing can cause subsurface damage without ablation or vaporization. Bonding the surface to the component can include bonding with an adhesive.

The methods described herein can include one or more of the following advantages. A surface can be formed using subsurface focused laser dicing. The laser diced surface can be suitable for bonding to another surface without requiring a further processing step such as polishing or cleaning. Consequently, there is no need to remove residue or slag that is a byproduct of a further processing step can be avoided. Thus, devices can be formed without introducing debris into existing features in a die, such as channels. Low surface roughness of the body and component allow the two to be bonded to one another in such a way that prevents delamination or gaps from being between the bonded parts, which can cause the assembly to not function properly. Because there are fewer processing steps required, devices can be produced more quickly. The dicing and bonding described herein allows for the formation of MEMS having a number of layers, where some layers are perpendicular to other layers. Devices can be formed that have greater packing density than with conventional techniques. The laser dicing allows for use of a greater amount of the substrate than with other methods, such as breaking or vaporizing, because little to no substrate is lost in the dicing process. A multilayer device formed by bonding a part onto the edge can allow for the formation of a greater variety of more complex structures. These more complex structures can be smaller in the process direction. That is, the footprint of a die can be smaller. Small devices and dies can allow for creation of smaller overall apparatuses in which the devices are located. Thus, multiple modules can be stacked in a small space, such as within a printing zone. This can allow for higher resolution printing. Small devices can also be more economical to produce. Substantially smooth, flat or planar surfaces that can be created by the dicing methods described herein can also be used to align a die to another component.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

A method of forming a die with MEMS is described that uses subsurface focused laser dicing to form a clean, substantially smooth surface that that can be used as a bonding surface. A component, such as a smooth faced plate, is bonded onto the diced surface. The surface created by dicing does not need further processing in order for an adhesive to be able to bond another component onto the surface.

Figure 1:
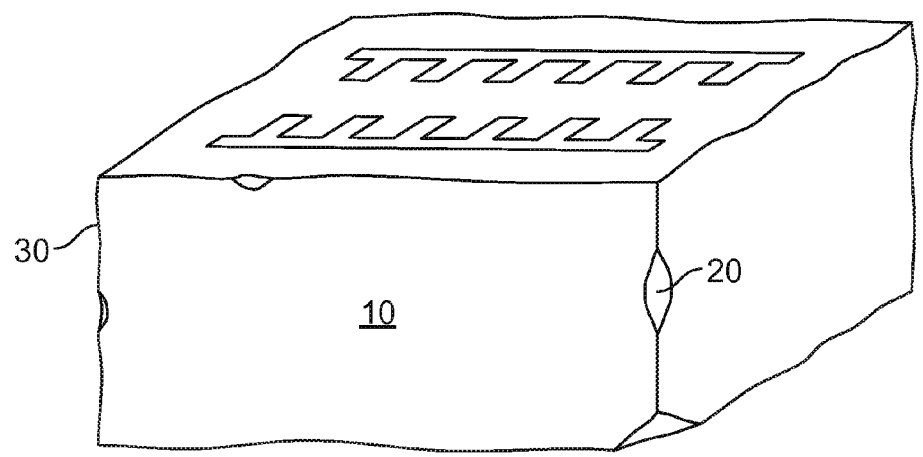
FIG. 1 is a perspective view of a MEMS containing die.
Figure 2:
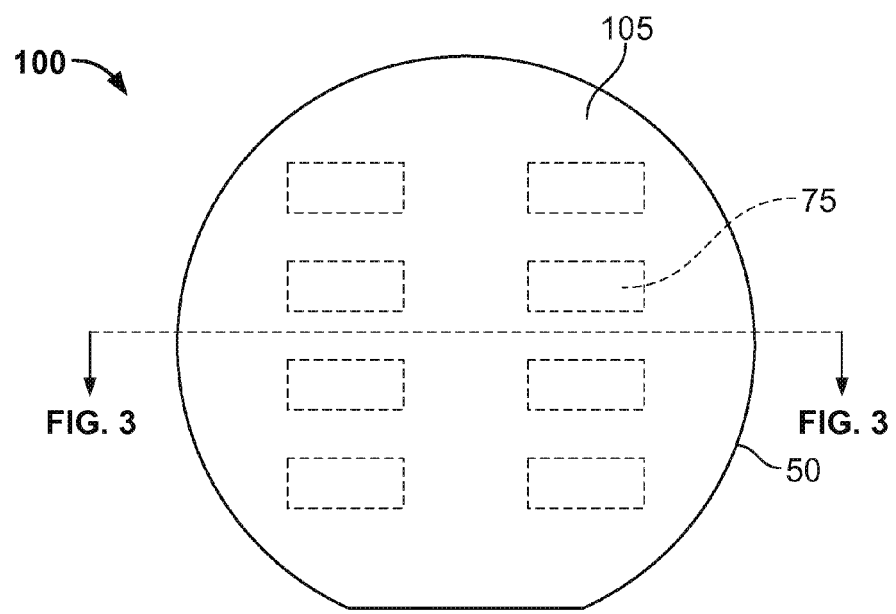
FIG. 2 is a plan view of an assembly used to form multiple dies.
Figure 3:
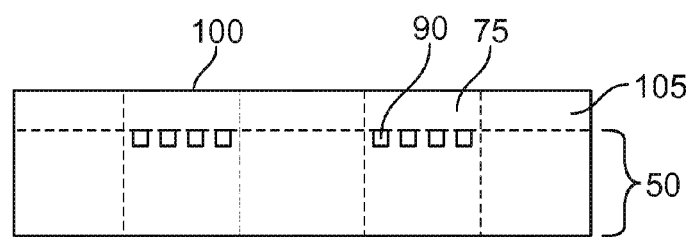
FIG. 3 is a cross sectional view of an assembly used to form dies.

Referring to FIGS. 2 and 3, a substrate 50 includes one or more regions 75 (the boundaries of the regions 75 are shown in phantom) that include features or microfabricated structures, such as recesses or chambers 90. The regions 75 will eventually be separated from the substrate to form individual dies. Although the regions 75 are shown as separated by a space, they can be directly adjacent to one another. The substrate 50 can include a layer of a single crystalline material, e.g., a semiconductor, such as silicon, sapphire or a III-V type material, such as gallium arsenide. Multiple dies can be processed on a substrate simultaneously to avoid material waste. Embedded features can be formed by processing one layer of a substrate, such as by etching, for example, deep reactive ion etching, and bonding a second layer 105 onto the processed layer to form an assembly 100. The second layer 105 can also be a single crystalline material, e.g., the same material as the substrate 50. An exemplary multilayer processing procedure is described in U.S. Publication No. U.S. 2005-0099467, published May 12, 2005, which is incorporated by reference for its description of the device and method of forming the device.

Figure 4:
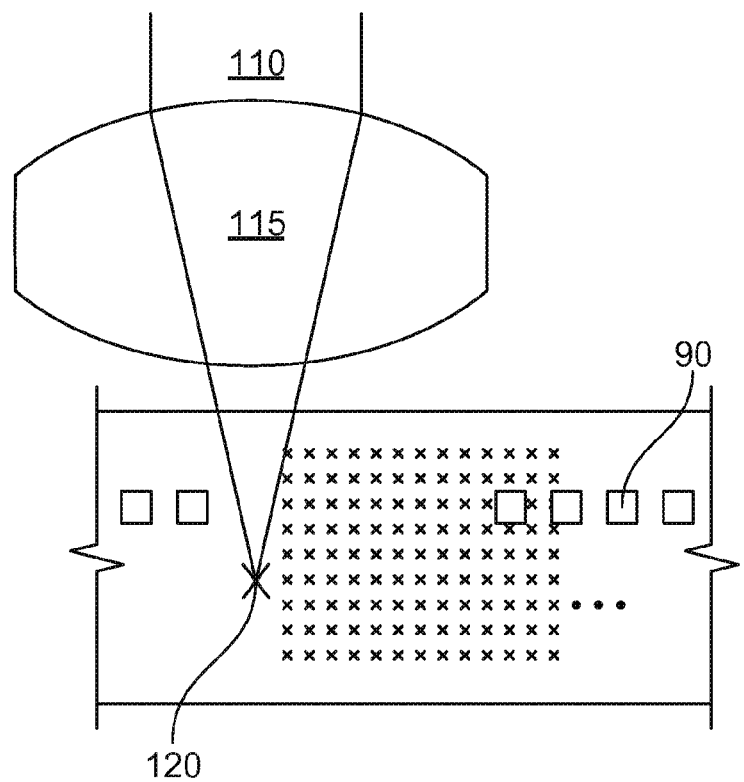
FIG. 4 is a schematic representation, in cross-section, of laser dicing.

Referring to FIG. 4, once processing on the substrate or assembly 100 is completed and the dies are to be separated from the assembly 100, laser dicing is performed on the assembly 100. The laser dicing is subsurface focused laser dicing that creates subsurface damage or holes. The material is not vaporized or ablated. Laser light 110 is focused by a condensing lens 115 at various non-surface points 120 of the assembly 100. The condensing lens 115 causes the energy to be focused intensely enough that when the laser hits peak power density at the focused location, or the focal point, a hole is created. Compressive and tensile stress is caused around the hole. A series of holes creates an internal perforation. The laser treated substrate remains intact after the dicing. In some embodiments, the internally perforated substrate is attached to a tape. The tape is expanded, such as by mechanically stretching the tape, and the stress areas introduced along the perforation cause the substrate to separate along the perforation.

The laser light uses multiphoton absorption, or optical damage, to create the small holes along what is to be the surface of the die. The laser light has a wavelength that can be transmitted through the material of the assembly 100. That is, the substrate must be semi-transparent to the laser light wavelength. For a silicon substrate, a laser with near-infrared light can be used, because absorption of shorter wavelengths by silicon causes ablation. In some embodiments, the laser is pulsed and during each pulse the laser light is focused at one spot. Before a subsequent pulse the laser light is focused at a subsequent spot, such as a spot 30 microns away. This procedure is repeated until a sufficient number of spots have been formed and the die can be separated from the rest of the substrate.

The laser can be a YAG laser that emits light with a wavelength around 1500 Angstroms, such as 1520 or 1560 Angstroms. For example, an Accretech ML200 laser can be used. If silicon is being diced, the laser's power level can be about 1.2 W and focused to about 2 mega-watt/cm$^2$. The scan speed can be adjustable from about 100-500 mm/s, such as 150 mm/s for SOI wafers and 300 mm/s for silicon wafers. The laser can be pulsed at about 40-80 kHz. The laser is advanced laterally through the layer to complete a scan and then upwards through the layer about 20-30 microns each scan. The power level can be reduced to about 20% near the surface to prevent surface ablation. An assembly up to many hundreds of microns thick, such as about 800 or 900 microns, can be diced in this way.

The points at which the laser light is focused determine the geometry of the die surface. The laser treatment can separate a die irrespective of the crystalline structure of the substrate. If the points are all along a plane, the die surface will be planar. If the points are along another geometry, such as along a curve, the die surface will be along that geometry, i.e., curved. Because of the ability to form walls with no chips, the edges of the die can form 90 degree angles with the walls that they meet. Thus, squared corners can be formed on this die. An exemplary system for dicing dies is the ML200 available from Accretech, Tokyo, Japan.

When the substrate that is being diced is formed of crystalline silicon, the laser dicing process causes the single silicon to convert to polysilicon. When viewed under a microscope, such as a scanning electron microscope, the polysilicon surface can be distinguished from a crystalline silicon surface because of its wavy appearance. Thus, the exposed surface of the die that has been subsurface focused laser diced has a wavy appearance and the underlying silicon has an ordered crystalline appearance. Typically, the diced surface will have a roughness between about 10 Angstroms and 20 microns, such as about 0.45 microns ra. The surface is distinguishable from most polished silicon surfaces, because it is somewhat rougher than a polished silicon surface. The laser treatment of the substrate converts the crystal structure of the substrate rather than vaporizing or removing material. There is no generation of particles due to the subsurface focused laser dicing process.

In the dies shown herein, a main surface is the largest surface on the die. Side surfaces are smaller than the main surfaces and in some embodiments, are perpendicular to the main surfaces. However, the sides surfaces can be at angles other than 90 degrees to the main surface.

Figure 5:
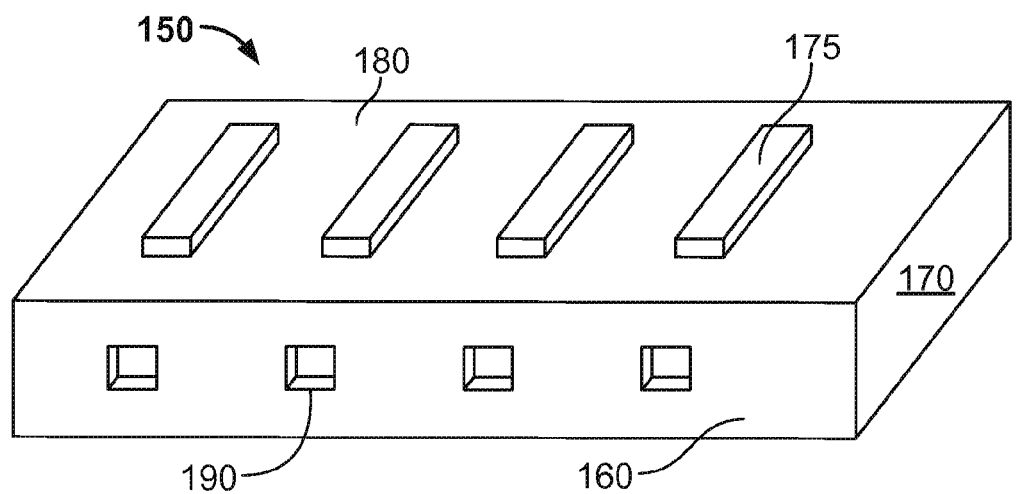
FIG. 5 is a perspective view of a die.

Referring to FIG. 5, a die 150 results from the dicing process. As an example of a MEMS containing die that can be formed, a die could include a number of MEMS structures suitable for jetting fluid, for example, an ink jet printhead. Of course, other types of MEMS dies could be formed. In the exemplary device, the cavities are chambers for holding fluid, such as ink. The fluid can be expelled from the die 150 through apertures 190 in a side surface 160 of the die. In some embodiments, the cavities are formed by etching features into a substrate. The features can have straight walls. The features can be etched through the thickness of the substrate or only part way through the substrate. If the features extend the entire way through the substrate, a layer or a second substrate can be bonded onto the bottom of the substrate. If the features are only etched part way through the substrate, there may be no need for the bonded lower layer. Another layer or substrate can then be bonded onto the top of the substrate. The bonding can either be an adhesive bonding or another type of bonding, such as a direct silicon bond or a fusion bond.

Actuators 175 can be formed on a main surface of the die. In some embodiments, the actuators are piezoelectric actuators that each associated with a chamber in the die. Suitable piezoelectric actuators are described in U.S. Pat. No. 7,420,317, which is incorporated by reference for its description of the device and processing techniques.

Figure 6:
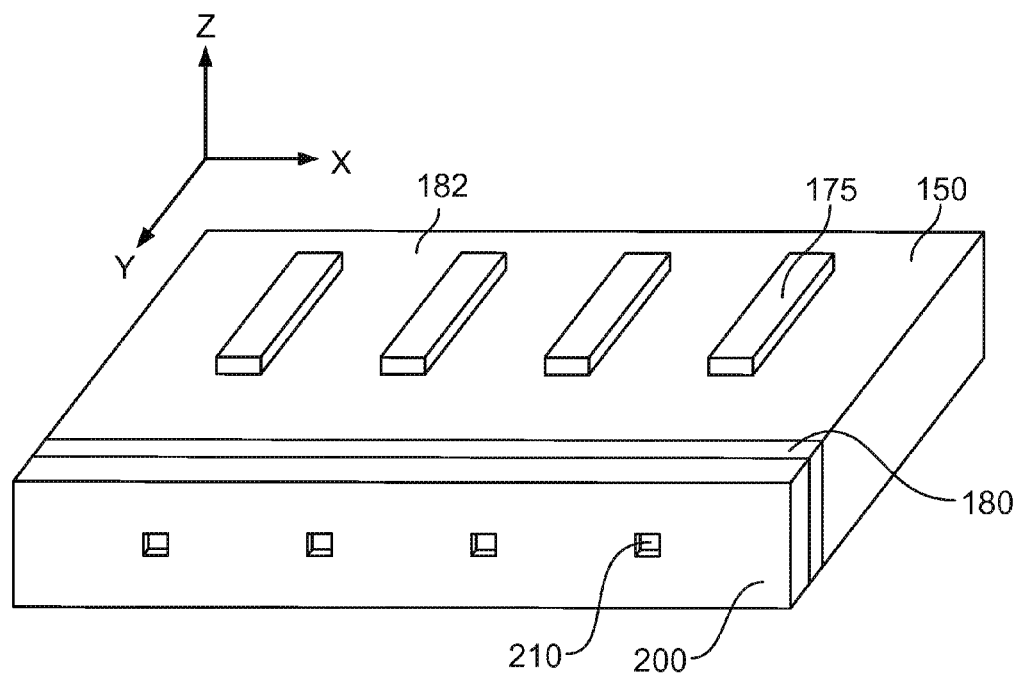
FIG. 6 is a perspective view of a die with a bonded component.

As shown in FIG. 6, the diced surfaces 160, 170 have a low enough roughness for adhesive bonding to the nozzle plate 200. The die 150 has a thickness along the z axis, a depth along the y axis and a length along the x axis. The nozzle plate 200 has a depth along the y axis that is less than the depth of the die and nozzle outlets 210 on a surface that runs along a surface in the xz plane. The nozzle plate 200 is bonded onto the die 150 with a bonding material 180 or adhesive so that nozzle outlets 210 are in fluid communication with apertures 190. A nozzle plate that is bonded to the die can be electroformed, a silicon etched plate, a ceramic injection molded plate or any other type of plate desired. If the nozzle plate 200 and die are both formed of single crystal silicon, they need not be formed in silicon with the same orientation. The adhesive can be an epoxy or other organic bonding material, such as benzocyclobutene (BCB). Typically, adhesive bonding that is not prone to failure typically requires the surfaces of the die and the nozzle plate to each have a surface roughness of less than about 20 microns, such as less than about 10 microns. In some embodiments the surface roughness is not significantly greater than the bonding material thickness.

A layer of bonding material is applied to either the die 150 or the nozzle plate 200. In some embodiments, a thin adhesive or bonding layer, such as a layer on the order of 1 micron, is used. This prevents the adhesive squeezing out during bonding and clogging the nozzle. The die 150 and nozzle plate 200 are brought together with the bonding material 180 therebetween and the nozzles 210 aligned with apertures 190. The bonding material is allowed to cure. Subsurface focused laser dicing achieves surfaces with this smoothness and thus forms surfaces that are suitable for adhesive bonding. Because other surfaces of the die have been created using the laser dicing technique, the other surfaces can be bonded to, such as to attach a manifold for supplying fluid to the die. Alternatively, or in addition, the other surfaces can be used to align the die to another structure in a device, such as an alignment feature or a housing. For example, a diced side of the die can be used to align the die to a neighboring die or for aligning the die within a housing. This can be useful in forming a full page width print bar containing multiple ink jet printing dies.

Figure 7:
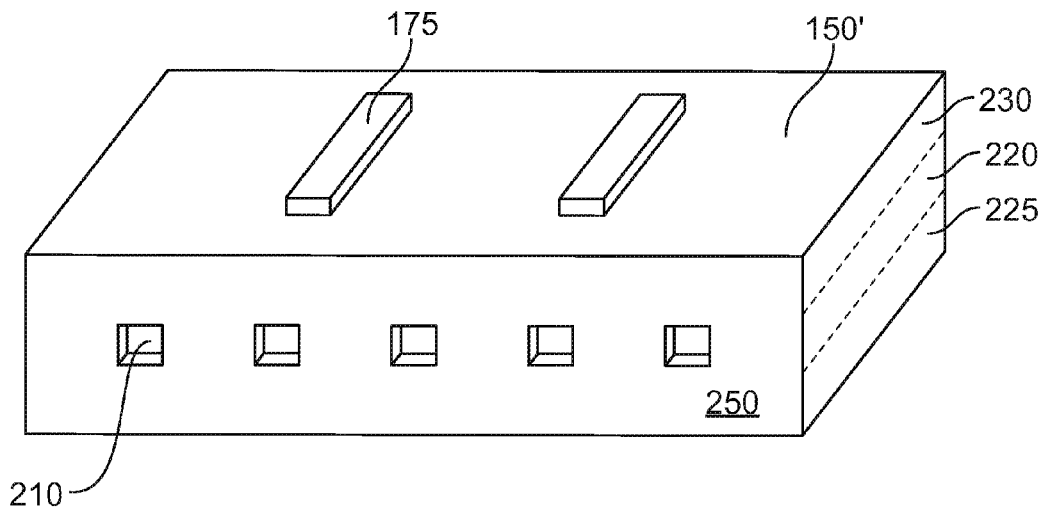
FIG. 7 is a perspective view of an alternative embodiment of a die prior to bonding on a bonded component.
Figure 8:
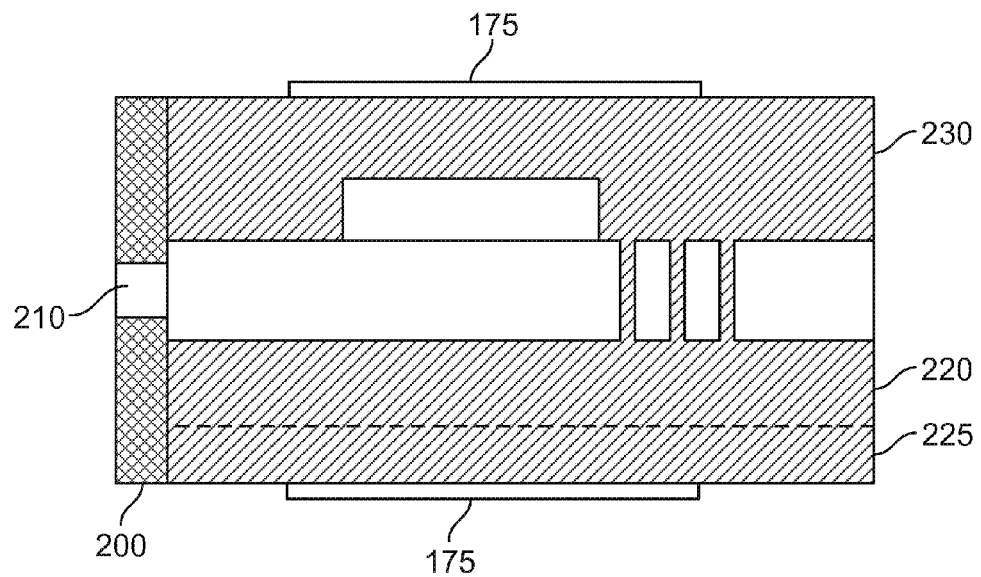
FIG. 8 is a cross sectional side view of a die after bonding.

The device described above can be referred to as an edge shooter device, because the actuators are on the top of the device, and in some instances also on the bottom of the device, and the nozzles are positioned along an edge of the device. As shown in FIG. 7, an edge shooter type die with actuators on both sides can be formed by etching features into a primary substrate 220. A lower substrate 225 and an upper substrate 230 are bonded to the primary substrate 220. Actuators 175 are formed on the top surface and bottom surface (a proximate top actuator 175 is visible in FIG. 8, as well as a more distal bottom actuator 175).

Figure 9:
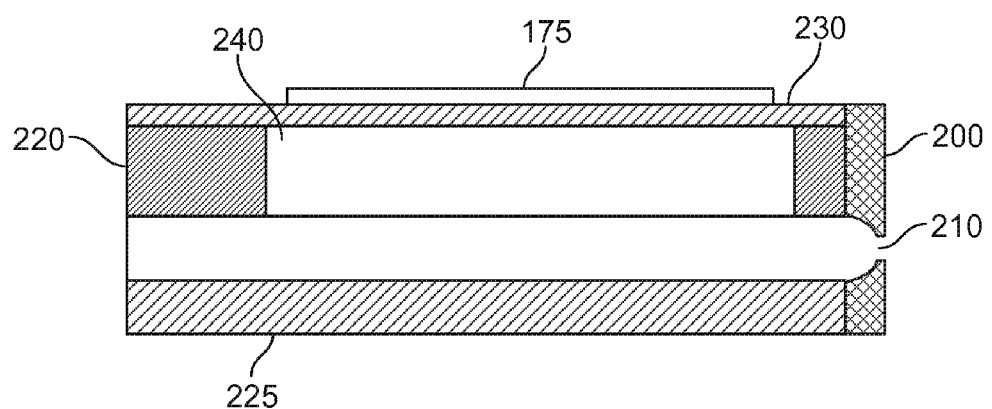
FIG. 9 is a cross section side view of an embodiment of a die.

As shown in FIG. 9, actuators 175 can be placed only on a single side of the die. This can reduce the number of process steps and simplify the electrical connections required with respect to a die having actuators on both sides. For example, because the actuator 175 is adjacent to a pumping chamber 240 and the actuators are only on one side of the device, pumping chambers 240 only need to be etched in one step, as opposed to etching in two different steps, as may be required to form a die with actuators on opposing sides.

In some embodiments, the length to depth ratio of the pumping chamber is at least 5:1, such as greater than 10:1 or greater than 20:1. Thus, the face of the die can be very small and many dies can be stacked next to one another, allowing for greater possible printing resolution. The edge shooter structure can provide greater packing density than an ink jet device with nozzles on a face of the die (known as a faceshooter).

The die 150 that is subsurface focused laser diced has one or more surfaces 250, such as four surfaces, that are suitable for adhesively bonding onto components, such as a nozzle plate, manifold or other such component. As with the laser diced surface, the surface of the component attached to the die should have the requisite maximum roughness for successful bonding. The method described herein can be applied to any MEMS type structure that can be formed in part by bonding a layer or component onto a side of a die that has been cut from a substrate. Although the process has been described with respect to forming an end shooter type ink jet device, other types of ink jet devices or non-ink jet devices that are formed in a substrate that can be diced and bonded. Because the concentrated light laser dicing leaves a surface that is very smooth, the surface is well suited for bonding to a plate without any necessary intermediary processing or cleaning steps. That is, polishing or other means for removing chips, microcracks or burrs are not necessary to achieve a bondable surface. Such additional processing could leave bits of debris in the recesses of the die, which would reduce uniformity of the MEMS structures and reproducibility of their behavior upon actuation.

A number of embodiments of the invention have been described. Nevertheless, it will be understood that various modifications may be made without departing from the spirit and scope of the invention. Accordingly, other embodiments are within the scope of the following claims.

What is claimed is:
1. An assembly, comprising:
a body having a main surface and a first side surface adjacent to the main surface and in a plane different from a plane of the main surface, the first side surface being nonparallel to the main surface and being smaller than the main surface, wherein the body is formed of silicon and the first side surface is formed of silicon, and wherein the silicon in the body is in a form of crystalline silicon, and the silicon in the first side surface is in a form of polysilicon;

a component bonded to the first side surface with an adhesive, wherein the body includes an outlet in the first side surface and the component includes an aperture in fluid connection with the outlet;

an actuator disposed on an exterior of the main surface adjacent to a chamber; and a manifold attached to a second side surface, the crystalline structure of the body is different from the second side surface, the manifold configured to supply fluid to the assembly.

2. The assembly of claim 1, wherein the first side surface is free from chips and burrs.

3. The assembly of claim 1, wherein the outlet is in fluid communication with the chamber and the actuator is associated with and configured to change a volume of the chamber.

4. The assembly of claim 3, wherein the component is a nozzle plate and the aperture is a nozzle.

5. The assembly of claim 1, wherein the first side surface is a substantially flat planar surface.

6. The assembly of claim 1, wherein the first side surface has a surface with a roughness between about 5 Angstroms and 5 microns ra.

7. The assembly of claim 1, wherein the first side surface is not a polished surface.

8. The assembly of claim 1, wherein the first side surface is perpendicular to the main surface.

9. The assembly of claim 1, wherein the body has a plurality of outlets in the first side surface that is in fluid communication with a plurality of apertures in the component.

10. A method of forming an assembly, comprising:

laser dicing a body containing a material in a form of a single crystal to form a die including MEMS, wherein the laser dicing focuses laser light at a plurality of points through a thickness of the body, the points defining a first side surface of the die in a plane different from a plane of a main surface of the die, the first side surface being nonparallel to the main surface and being smaller than the main surface, and the material in the first side surface being in a form different from a single crystal;

forming an outlet in the first side surface, bonding the first side surface to a component, the component including an aperture in fluid connection with the outlet, disposing an actuator on an exterior of the main surface adjacent to a chamber; and attaching a manifold to a second side surface, the manifold configured to supply fluid to the assembly, the material in the second side surface is in a form different from a single crystal.

11. The method of claim 10, wherein forming the outlet comprises forming a recess in the main surface of a substrate, wherein the substrate is part of the body and the main surface of the substrate is perpendicular to the first side surface of the body; and laser dicing the body to form the outlet in the first side surface from the recess in the main surface.

12. The method of claim 11, wherein the outlet is fluidly connected to a chamber that defines a volume, the method further comprising bonding a transducer to the body, wherein the transducer is configured to modify the volume when actuated.

13. The method of claim 12, further comprising:

laser dicing a second surface that is perpendicular to the main surface of the substrate; and using the second surface to align the die to a vertical surface.

14. The method of claim 10, wherein the material is silicon and the silicon in the first side surface is in a form of polysilicon.

15. The method of claim 10, wherein the laser dicing causes subsurface damage without ablation or vaporization.

16. The method of claim 10, wherein bonding the first side surface to the component includes bonding with an adhesive.

17. The assembly of claim 3, wherein the actuator is applied to the main surface.

18. The method of claim 12, wherein the transducer is bonded to the main surface of the body.

19. An assembly, comprising:

a body having a main surface and a first side surface adjacent to the main surface and in a plane different from a plane of the main surface, the first side surface being nonparallel to the main surface and being smaller than the main surface, wherein the body is formed of a material and the first side surface is formed of the material, and wherein the material in the body is in a crystalline structure that is different from a structure of microscopic atomic arrangement of the material in the first side surface;

a component bonded to the side surface with an adhesive, wherein the body includes an outlet in the first side surface and the component includes an aperture in fluid connection with the outlet, wherein the material comprises silicon;

an actuator disposed on an exterior of the main surface adjacent to a chamber; and a manifold attached to a second side surface, the crystalline structure of the body is different from the second side surface, the manifold configured to supply fluid to the assembly.

* * * * *